United States Patent [19]

Belouet et al.

[11] Patent Number: 5,595,960
[45] Date of Patent: Jan. 21, 1997

[54] METHOD OF DEPOSITING A SUPERCONDUCTOR LAYER ON A SUBSTRATE THROUGH AN INTERMEDIATE LAYER OF DOPED $CEO_2$

[75] Inventors: Christian Belouet, Sceaux; Didier Chambonnet, Chatillon, both of France

[73] Assignee: Alcatel Alsthom Compagnie Generale d'Electricite, Paris Cedex, France

[21] Appl. No.: 542,881

[22] Filed: Oct. 13, 1995

[30] Foreign Application Priority Data

Oct. 27, 1994 [FR] France .................................. 94 12882

[51] Int. Cl.⁶ ...................................................... B05D 5/12
[52] U.S. Cl. ........................ 505/473; 505/238; 505/239; 427/62; 427/596
[58] Field of Search .................................. 505/238, 239, 505/473; 427/62, 63, 596

[56] References Cited

U.S. PATENT DOCUMENTS 4,940,693  7/1990  Shappiro et al. .
5,262,394  11/1993  Wu et al. .
5,416,062  5/1995  Harada et al. ........................ 505/237

*Primary Examiner*—Roy V. King
*Attorney, Agent, or Firm*—Sughrue, Mion, Zinn, Macpeak & Seas

[57] ABSTRACT

A method of preparing a substrate with a view to depositing a thin layer of a superconductive material thereon, wherein an operation is performed of depositing on the substrate an intermediate material having the property of having a crystal lattice constant that is a function of the percentage of a doping element, the depositing operation being initiated with a concentration of the doping element such that the lattice constant of the intermediate material is equal to or as close as possible to the lattice constant of the substrate, the proportion of the doping element being continuously varied during the depositing operation to a proportion of the doping element such that the lattice constant of the intermediate material is equal to or as close as possible to the lattice constant of the superconductive material.

5 Claims, 1 Drawing Sheet

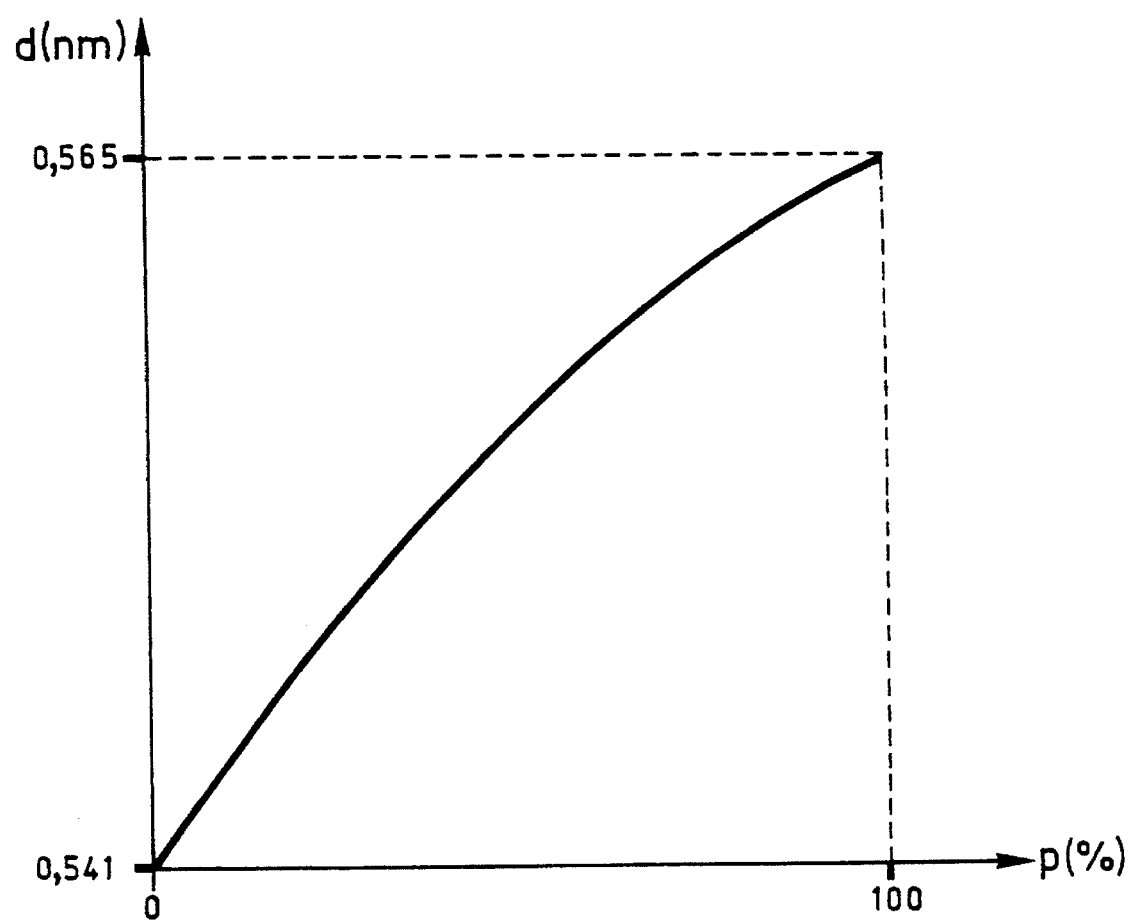

METHOD OF DEPOSITING A SUPERCONDUCTOR LAYER ON A SUBSTRATE THROUGH AN INTERMEDIATE LAYER OF DOPED $CEO_2$

The present invention relates to depositing thin layers of superconductive material on crystalline substrates.

BACKGROUND OF THE INVENTION

The use of thin films of superconductive material, in particular of so-called "high critical temperature" superconductive material, is likely to see major development, in particular for microwave applications in electronic instrumentation, etc. . . .

In most applications, it is almost always essential to obtain monocrystalline layers, so as to enable electrical waves to propagate without disturbance.

A method known in the semi-conductor art for obtaining a monocrystalline layer of a material on a substrate is the epitaxial method; to work it requires the crystal lattice constant of the deposited material to be equal or very close to that of the substrate.

That method is not directly applicable in the case of high temperature superconductive materials such as YBaCuO, because their lattice constants differ from those of substrates generally used.

A method, called the hetero-epitaxial method, is also known for depositing a thin layer on a substrate, which method consists in interposing between the substrate and the material to be deposited, a layer of a material having a lattice constant halfway between that of the substrate and that of the material to be deposited.

That method allows a layer to be obtained which is more even than that which would be obtained without the presence of the intermediate layer, but that layer is still too uneven for the intended applications.

OBJECTS AND SUMMARY OF THE INVENTION

An object of the present invention is to define a method of depositing a perfectly even monocrystalline layer on a substrate.

The invention provides a method of preparing a substrate with a view to depositing a thin layer of a superconductive material thereon, wherein an operation is performed of depositing on the substrate an intermediate material having the property of having a crystal lattice constant that is a function of the percentage of a doping element, the depositing operation being initiated with a concentration of the doping element such that the lattice constant of the intermediate material is equal to or as close as possible to the lattice constant of the substrate, the proportion of the doping element being continuously varied during the depositing operation to a proportion of the doping element such that the lattice constant of the intermediate material is equal to or as close as possible to the lattice constant of the superconductive material.

Advantageously, the operation of depositing the intermediate material is achieved by a method of ablation by means of a pulsed laser.

In an implementation of the invention, the superconductor is YBaCuO (the exact formula being $YBa_2Cu_3O_{7-\delta}$), the substrate material is $SrTiO_3$, the intermediate element is albanite $CeO_2$, and the doping element is lanthanum oxide.

The invention also provides a method of depositing a thin layer of superconductive material on a substrate, the method being comprising the following operations:

preparing the substrate by the above method; and depositing the superconductive material on the substrate thus prepared, by a method such as a heteroepitaxial deposition.

The invention is now explained by describing an implementation of the method of the invention.

BRIEF DESCRIPTION OF THE DRAWING

The sole FIGURE is a diagram showing the crystal lattice constant d of albanite $CeO_2$ as a function of the percentage p of lanthanum oxide $La_2O_3$.

MORE DETAILED DESCRIPTION

The example chosen to illustrate the invention is depositing a film YBaCuO on a substrate made of $SrTiO_3$ The lattice constant of the $SrTiO_3$ is equal to 0.552 nm (nanometers) and that of YBaCuO to 0.5496 nm. This difference in size does not allow epitaxial growth to be achieved since that requires equal lattice constants.

In the invention, an intermediate material is used which is albanite $CeO_2$ doped with lanthanum oxide. A property of this compound is a lattice constant which varies from 0.541 nm to 0.565 nm as the proportion of lanthanum oxide varies from 0% to 100%, as shown in the FIGURE.

The method of the invention is preferably implemented by the Pulsed Laser-assisted Deposition (PLD) technique which is summarized briefly below.

An albanite target and a lanthanum oxide target close to the $SrTiO_3$ substrate are bombarded alternately with a pulsed laser. For example, the laser pulses last about 30 nanoseconds and they are at a frequency that is variable over the range 1 Hz to 100 Hz. The respective bombardment times of the albanite and of the dopant are changed progressively so that the proportion of dopant in the albanite varies progressively, thereby decreasing the lattice constant of the material deposited on the substrate from 0.5521 nm to 0.5496 nm.

The relative slowness of the deposition speed and the high frequency of operation of the laser allows the composition of the intermediate material to be varied very evenly during the process, and consequently makes it possible to obtain a very even variation in the lattice constant of the material deposited on the substrate.

Once the substrate has been treated as indicated, it is possible to deposit the superconductive material thereon by hetero-epitaxy and to obtain a monocrystalline layer of very high quality.

The invention is not limited to the example described but applies whenever it is possible to find an intermediate material having a lattice constant which varies with the proportion of a dopant, so as to match the lattice constant of the substance to be deposited.

The invention applies, in particular, when the substrate is a perovskite, a lead zirconate titanate (PZT), a lead lanthanum zirconate titanate (PLZT), etc. . . .

We claim:

1. A method of preparing a substrate for depositing a thin layer of a superconductor material thereon, wherein an operation is performed of depositing on the substrate an intermediate material having a crystal lattice constant that is a function of the percentage of a doping element, the depositing operation being initiated with a concentration of the doping element such that the lattice constant of the intermediate material is equal to or as close as possible to the lattice constant of the substrate, the proportion of the doping element being continuously varied during the depositing operation to a proportion of the doping element such that the lattice constant of the intermediate material is equal to or as close as possible to the lattice constant of the superconductor material.

2. A method according to claim 1, wherein the operation of depositing the intermediate material is achieved by a method of pulsed laser ablation.

3. A method according to claim 1, wherein the superconductor is $YBa_2Cu_3O_{7.5}$(YBCO), the substrate material is $SrTiO_3$, the intermediate element is albanite $CeO_2$, and the doping element is lanthanum oxide.

4. A method according to claim 1, further comprising the step of:

depositing the superconductor material on the substrate thus prepared.

5. A method according to claim 4, wherein said step of depositing the superconductor material on the substrate comprises depositing by heteroepitaxial deposition.

* * * * *